(12) United States Patent
Tang et al.

(10) Patent No.: US 12,120,886 B2
(45) Date of Patent: Oct. 15, 2024

(54) MEMORY DEVICE AND MANUFACTURING METHOD THEREOF

(71) Applicant: TAIWAN SEMICONDUCTOR MANUFACTURING COMPANY, LTD., Hsinchu (TW)

(72) Inventors: Pei-Sheng Tang, Taipei (TW); Wei-De Ho, Hsinchu (TW); Han-Wei Wu, Tainan (TW); Yuan-Hsiang Lung, Hsinchu (TW); Hua-Tai Lin, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 421 days.

(21) Appl. No.: 17/461,355

(22) Filed: Aug. 30, 2021

(65) Prior Publication Data
US 2023/0067049 A1    Mar. 2, 2023

(51) Int. Cl.
*H10B 61/00* (2023.01)
*H10N 50/01* (2023.01)

(52) U.S. Cl.
CPC ............. *H10B 61/00* (2023.02); *H10N 50/01* (2023.02)

(58) Field of Classification Search
CPC .......... H10N 50/01; H01L 2223/54426; H01L 23/544
See application file for complete search history.

(56) References Cited

U.S. PATENT DOCUMENTS

| | | | |
|---|---|---|---|
| 2019/0165258 A1* | 5/2019 | Peng | H10N 50/10 |
| 2019/0348294 A1* | 11/2019 | Tseng | G03F 9/708 |
| 2020/0176510 A1* | 6/2020 | Wang | G11C 11/16 |

\* cited by examiner

*Primary Examiner* — Shih Tsun A Chou
(74) *Attorney, Agent, or Firm* — Birch, Stewart, Kolasch & Birch, LLP

(57) ABSTRACT

A method for manufacturing a memory device includes forming a dielectric layer over a wafer, wherein the wafer has a device region and a peripheral region adjacent to the device region. A bottom via opening is formed in the dielectric layer and over the device region of the wafer and a trench is formed in the dielectric layer and over the peripheral region of the wafer. A bottom electrode via is formed in the bottom via opening. A bottom electrode layer is conformally formed over the bottom electrode via and lining a sidewall and a bottom of the trench. A memory layer and a top electrode are formed over the bottom electrode layer.

20 Claims, 12 Drawing Sheets

MEMORY DEVICE AND MANUFACTURING METHOD THEREOF

BACKGROUND

In the semiconductor integrated circuit (IC) industry, technological advances in IC materials and design have produced generations of ICs where each generation has smaller and more complex circuits than the previous generation. In the course of IC evolution, functional density (i.e., the number of interconnected devices per chip area) has generally increased as a result of decreasing minimum feature size or geometry sizes (i.e., the smallest component (or line) that can be created using a fabrication process). Such scaling down has also increased the complexity of IC processing and manufacturing.

One type of feature that may be part of an integrated circuit is a magnetic tunnel junction (MTJ). An MTJ is a device that changes its resistive state based on the state of magnetic materials within the device. The MTJ involves spin electronics, which combines semiconductor technology and magnetic materials and devices. The spin polarization of electrons, rather than the charge of the electrons, is used to indicate the state of "1" or "0."

BRIEF SUMMARY OF THE INVENTION

A method for manufacturing a memory device includes forming a bottom via opening and a trench in a dielectric layer over a wafer, wherein the bottom via opening is formed in a device region of the wafer and the trench is formed in a peripheral region of the wafer. A bottom electrode via is formed in the bottom via opening. A bottom electrode layer is conformally formed over the bottom electrode via and lining a sidewall and a bottom of the trench. A memory layer and a top electrode are formed over the bottom electrode layer.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
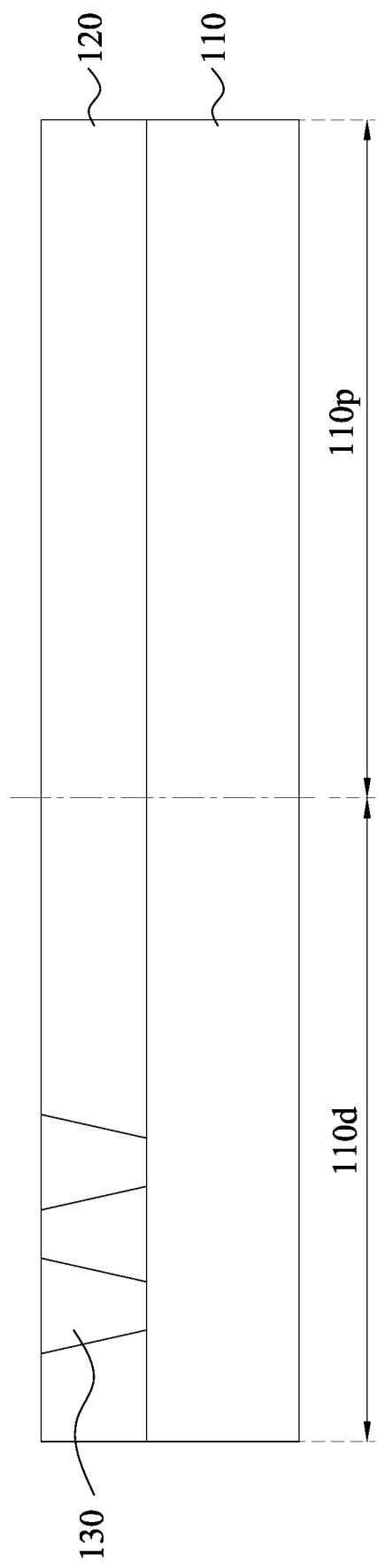
FIG. 1 to FIG. 12 illustrate a method for manufacturing a memory device at various stages in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, "around", "about", "approximately", or "substantially" shall generally mean within 20 percent, or within 10 percent, or within 5 percent of a given value or range. Numerical quantities given herein are approximated, meaning that the term "around", "about", "approximately", or "substantially" can be inferred if not expressly stated.

Some embodiments of this disclosure relate to integrated memory fabrications and more specifically to magnetoresistive memory formations by forming a memory device with magnetic tunnel junctions (MTJs). Because a distinguishable alignment mark is provided during a patterning of memory cells of the memory device, an overlay problem of a patterned mask for patterning the memory cells can be improved. For example, the patterned mask can be aligned to a bottom electrode via directly under the memory cell. Further, manufacture cost may be saved due to process modification.

FIG. 1 to FIG. 12 illustrate a method for manufacturing a memory device at various stages in accordance with some embodiments of the present disclosure. Reference is made to FIG. 1. A wafer 110 is provided. The wafer 110 includes a device region 110d and a peripheral region 110p adjacent to the device region 110d. For example, the peripheral region 110p surrounds the device region 110d. In some embodiments, the wafer 110 is a substrate. In some other embodiments, the wafer 110 includes a substrate and a logic circuit over the substrate. The substrate may be a silicon substrate. Alternatively, the substrate may include another elementary semiconductor, such as germanium; a compound semiconductor including silicon carbide; an alloy semiconductor including silicon germanium; or combinations thereof. In some embodiments, the substrate is a semiconductor on insulator (SOI) substrate. The substrate may include doped regions, such as p-wells and n-wells. In some embodiments, the wafer 110 is a workpiece that includes the substrate and various features formed in and over and attached to the substrate. In some embodiments, the logic circuit includes transistors formed by transistor fabrication processes and may be a planar transistor, such as polysilicon gate transistors or high-k metal gate transistors, or a multi-gate transistor, such as fin field effect transistors.

A first dielectric layer 120 is then formed over the wafer 110. In some embodiments, the first dielectric layer 120 may include, for example, silicon oxide, low-k silicon oxide such as a porous silicon oxide layer, other suitable dielectric material, combinations thereof, or the like. In some embodiments, the first dielectric layer 120 is a low-k dielectric layer made from extra low-k materials, extreme low-k materials, combinations thereof, or the like. In some embodiments, the first dielectric layer 120 may have a dielectric constant lower than 2.4. In various examples, the first dielectric layer 120 may be deposited by an ALD process, a CVD process, a subatmospheric CVD (SACVD) process, a flowable CVD process, a PVD process, or other suitable process.

Thereafter, a plurality of conductive features 130 are formed in the first dielectric layer 120 for interconnecting memory cells (which will be discussed in FIG. 10) and the wafer 110. The conductive features 130 are formed over the device region 110d of the wafer 110. In other words, the peripheral region 110p of the wafer 110 does not have the conductive features 130 thereon. In some embodiments, the method of forming the conductive features 130 may include etching the first dielectric layer 120 to form trenches on the device region 110d of the wafer 110, and then filling conductive materials into the trenches to form the conductive features 130. In some embodiments, a planarization process, such as a CMP process, may be performed to remove excess materials. In some embodiments, the conductive features 130 include copper or copper alloys. In some other embodiments, the conductive features 130 include aluminum, tungsten, carbon, cobalt, TaN, or other suitable conductive materials. In still some other embodiments, each of the conductive features 130 may be a bilayer structure (e.g., a TaN layer and a TiN layer formed on the TaN layer).

Figure 2:
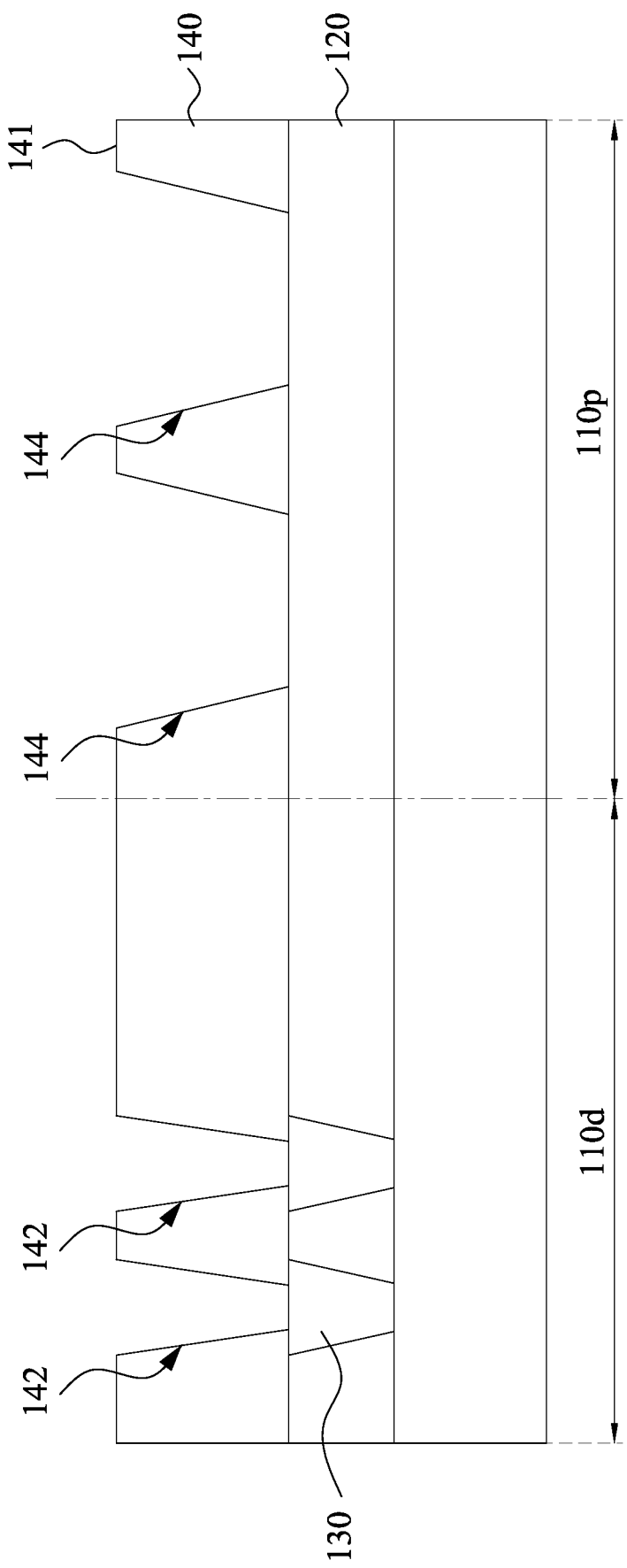

Reference is made to FIG. 2. After the conductive features 130 are formed, a second dielectric layer 140 is formed over the first dielectric layer 120 and conductive features 130. In some embodiments, the second dielectric layer 140 may include, for example, silicon oxide, low-k silicon oxide such as a porous silicon oxide layer, other suitable dielectric material, combinations thereof, or the like. In some embodiments, the second dielectric layer 140 is a low-k dielectric layer made from extra low-k materials, extreme low-k materials, combinations thereof, or the like. In some embodiments, the second dielectric layer 140 may have a dielectric constant lower than 2.4. In various examples, the second dielectric layer 140 may be deposited by an ALD process, a CVD process, a subatmospheric CVD (SACVD) process, a flowable CVD process, a PVD process, or other suitable process.

After the second dielectric layer 140 is formed, an etching process is performed to form at least one bottom via opening 142 in the second dielectric layer 140 over the device region 110d of the wafer 110 such that the conductive features 130 are exposed. The bottom via opening 142 extends from a top surface 141 of the second dielectric layer 140 to the conductive features 130. Further, the etching process is performed to form at least one trench 144 in the second dielectric layer 140 over the peripheral region 110p of the wafer 110 such that the first dielectric layer 120 is exposed. The trench 144 extends from the top surface 141 of the second dielectric layer 140 to the first dielectric layer 120. In some embodiments, a width of the bottom via opening 142 is smaller than a width of the trench 144. In some embodiments, the etching process of forming the bottom via opening 142 and the etching of forming the trench 144 are performed in one etching process. In some other embodiments, the etching process of forming the bottom via opening 142 and the etching of forming the trench 144 are performed in different etching processes.

In some embodiments, the etching process of forming the bottom via opening 142 and/or forming the trench 144 may use either dry or wet etching. When dry etching is used, the process gas may include $CF_4$, $CHF_3$, $NF_3$, $SF_6$, $Br_2$, HBr, $Cl_2$, or combinations thereof. Diluting gases such as $N_2$, $O_2$, or Ar may optionally be used. When wet etching is used, the etching solution (etchant) may include $NH_4OH:H_2O_2:H_2O$ (APM), $NH_2OH$, KOH, $HNO_3:NH_4F:H_2O$, and/or the like.

Figure 3:
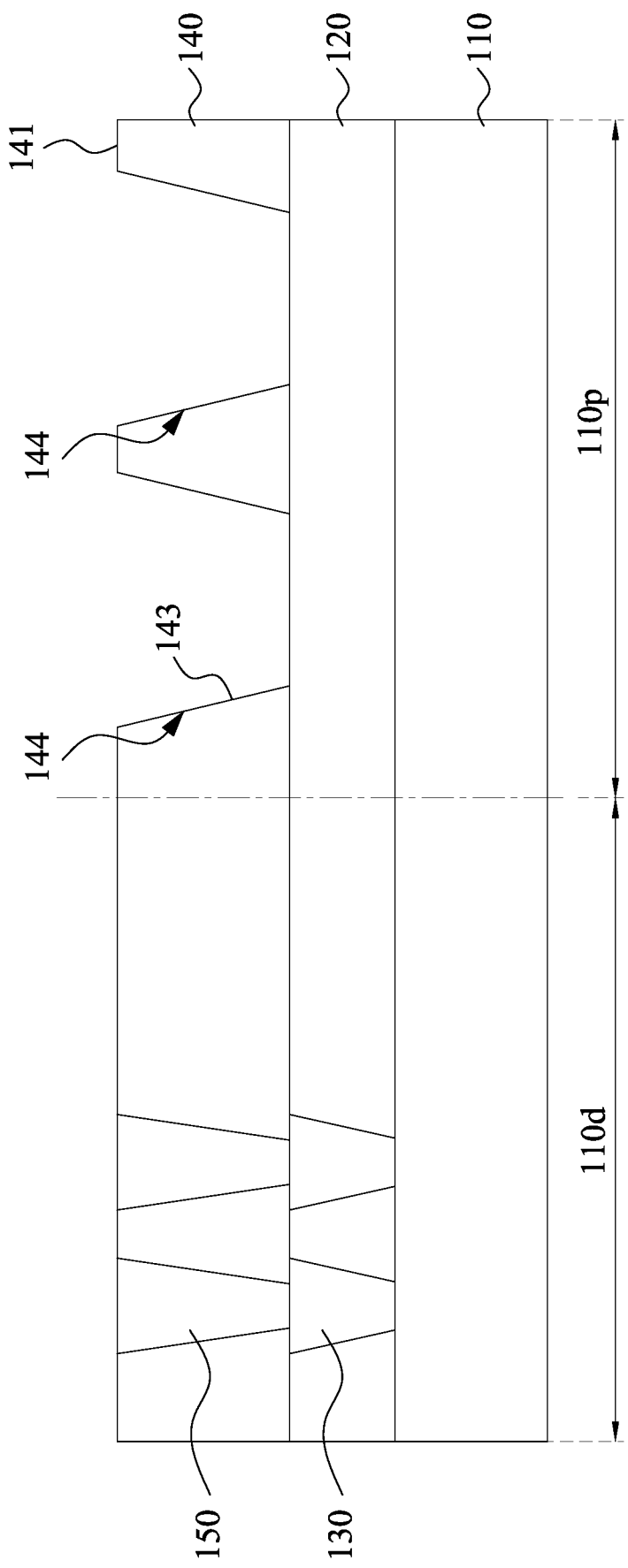

Reference is made to FIG. 2 and FIG. 3. A conductive material is filled in the bottom via openings 142 to respectively form bottom electrode vias 150 therein. The bottom electrode vias 150 are in contact with the conductive features 130, respectively. In some embodiments, the bottom electrode vias 150 may be made of metal, such as tungsten (W), cobalt (Co), ruthenium (Ru), aluminum (Al), copper (Cu), or other suitable materials. After the deposition of the bottom electrode vias 150, a planarization process, such as a chemical mechanical planarization (CMP) process, may be then performed to remove excess conductive material outside the bottom via openings 142. In some embodiments, the bottom electrode vias 150 are formed by performing a selectively growing process. Specifically, the bottom electrode vias 150 are selectively grown on a metal (e.g., the conductive features 130 in this case), and thus the bottom electrode vias 150 are formed in the bottom via openings 142 and not formed in the trench 144. As such, in this case, additional processes can be omitted (e.g., forming the bottom electrode via in the trench 144 and then removing the bottom electrode via in the trench 144), thereby saving the manufacture cost.

In some embodiments, a maximum width of the bottom electrode via 150 is smaller than a maximum width of the conductive feature 130. Specifically, a vertical projection of (a top surface of) the conductive feature 130 on the wafer 110 overlaps with a vertical projection of (a top surface of) the bottom electrode via 150 on the wafer 110.

In some embodiments, the bottom electrode vias 150 and the conductive features 130 include different materials. For example, the bottom electrode vias 150 are made of tungsten, while the conductive features 130 are made of copper.

Figure 4:
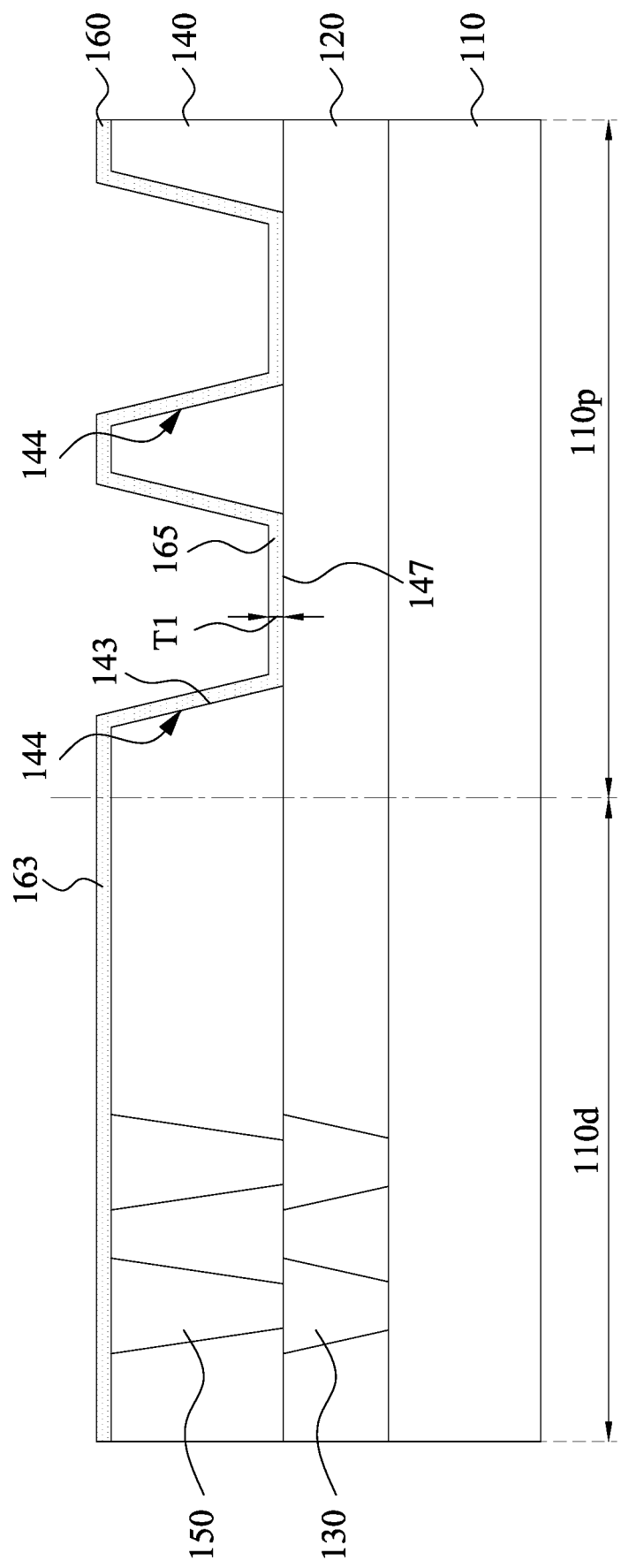

Reference is made to FIG. 4. A bottom electrode layer 160 is conformally formed over structure in FIG. 3. In greater details, the bottom electrode layer 160 is conformally formed over the second dielectric layer 140 and in the trench 144. The bottom electrode layer 160 is formed over the bottom electrode vias 150 and lining a sidewall 143 and a bottom 147 of the trench 144. The bottom electrode layer 160 covers the first dielectric layer 120, the second dielectric layer 140, and the bottom electrode vias 150. The bottom electrode layer 160 is in contact with a sidewall 143 of the second dielectric layer 140. In some embodiments, the bottom electrode layer 160 has a portion 163 over the device region 110d of the wafer 110 and a portion 165 in the trench 144. The portion 163 of the bottom electrode layer 160 is in contact with the bottom electrode via 150 and the second dielectric layer 140, while the portion 165 of the bottom electrode layer 160 is in contact with the first dielectric layer 120. The portion 163 of the bottom electrode layer 160 is higher than the portion 165 of the bottom electrode layer 160. In some embodiments, the bottom electrode layer 160 includes copper (Cu), aluminum (Al), tantalum (Ta), tungsten (W), tantalum nitride (TaN), titanium, titanium nitride (TiN), the like, and/or combinations thereof. In some embodiments, the bottom electrode layer 160 may be formed by a CVD process, a PVD process, an ALD process, the like, and/or a combination thereof.

In some embodiments, the bottom electrode layer 160 has a thickness T1 in a range of about 30 angstroms (Å) to about 60 angstroms. If the thickness T1 is less than about 30 angstroms, the bottom electrode layer 160 may expose the bottom electrode vias 150 and does not provide a good conductivity between the bottom electrode vias 150 and a memory layer (e.g., a memory material layer 170 in FIG. 5); if the thickness T1 is greater than about 60 angstroms, the trench 144 may not have sufficient space to accommodate other layers (e.g., the memory material layer 170 in FIG. 5 and/or a top electrode layer 180 in FIG. 6), thereby adversely affecting signal transmission of alignment marks AM (see FIG. 7).

Figure 5:
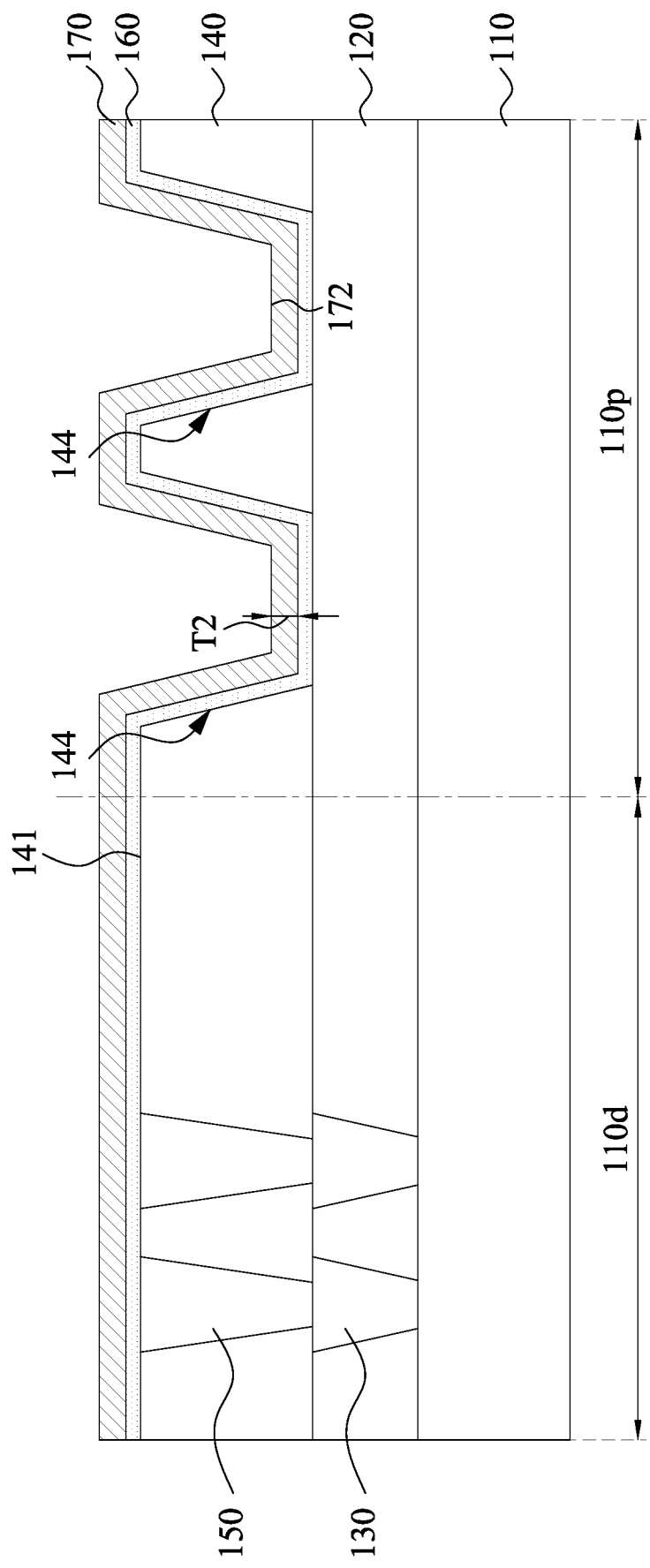

Reference is made to FIG. 5. A memory material layer 170 is conformally formed over structure in FIG. 4. In other words, the memory material layer 170 covers the bottom electrode layer 160. In some embodiments, the memory material layer 170 over the peripheral region 110p of the wafer 110 is spaced apart from the second dielectric layer 140. In some embodiments, a bottommost portion 172 of a top surface of the memory material layer 170 is lower than the top surface 141 of the second dielectric layer 140. In some embodiments, the memory material layer 170 includes copper (Cu), aluminum (Al), tantalum (Ta), tungsten (W), tantalum nitride (TaN), titanium, titanium nitride (TiN), the like, and/or a combination thereof. In some embodiments, the memory material layer 170 may be formed by a suitable technique, such as atomic layer deposition (ALD). Other chemical vapor deposition (CVD) techniques may be used. In another example, the memory material layer 170 may be formed by a physical vapor deposition (PVD), such as a sputtering process with a metallic target and with a gas supply to the PVD chamber. In yet another example, the memory material layer 170 may be formed an electron-beam deposition process.

In some embodiments, the memory material layer 170 is (a) magnetic tunnel junction (MTJ) layer(s). The MTJ layer(s) may include various layers formed of different combinations of materials. In some embodiments, the MTJ layer(s) include a pinning layer, a tunnel barrier layer, and a free layer. In addition, the MTJ layer(s) may have other variations including other layers, such as anti-ferro-magnetic layers. In some embodiments, the pinning layer is formed of PtMn, the tunnel barrier layer is formed of MgO, and the free layer is formed of CoFeB. The magnetic moment of the free layer may be programmed causing the resistance of the resulting MTJ cell to be changed between a high resistance and a low resistance. It is realized that MTJ layer(s) may have many variations, which are also within the scope of the present disclosure.

In some embodiments, the memory material layer 170 has a thickness T2 greater than the thickness T1 (see FIG. 4) of the bottom electrode layer 160. The thickness T2 of the memory material layer 170 is in a range of about 200 angstroms to about 300 angstroms. If the thickness T2 is less than about 200 angstroms, the memory material layer 170 may not provide a memory layer with distinguishable states; if the thickness T2 is greater than about 300 angstroms, the voltage or current for changing the state of the memory layer may be large, thereby consuming the power of the memory device and also adversely affecting signal transmission of alignment marks AM (see FIG. 7).

Figure 6:
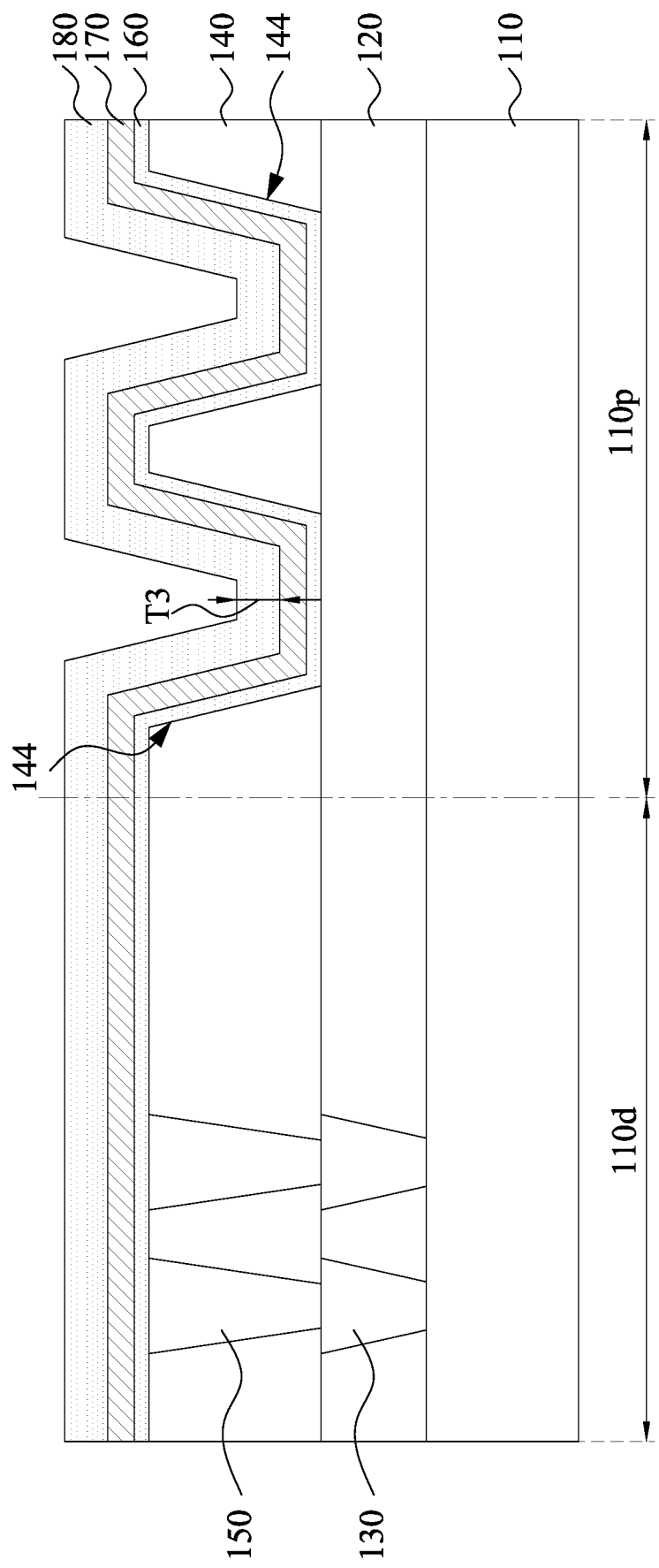

Reference is made to FIG. 6. A top electrode layer 180 is conformally formed over structure in FIG. 5. In greater details, the top electrode layer 180 covers the memory material layer 170. In some embodiments, the top electrode layer 180 includes copper (Cu), aluminum (Al), tantalum (Ta), tungsten (W), tantalum nitride (TaN), titanium, titanium nitride (TiN), the like, and/or a combination thereof. In some embodiments, the bottom electrode layer 160 and the top electrode layer 180 include the same materials, such as TiN. In some embodiments, the top electrode layer 180 may be formed by a CVD process, a PVD process, an ALD process, the like, and/or a combination thereof.

In some embodiments, the top electrode layer 180 has a thickness T3 greater than the thickness T2 (see FIG. 5) of the memory material layer 170. In some embodiments, the thickness T3 of the top electrode layer 180 is larger than the thickness T1 (see FIG. 4) of the bottom electrode layer 160. The thickness T3 of the top electrode layer 180 is in a range of about 550 angstroms to about 650 angstroms. If the thickness T3 is less than about 550 angstroms, the top electrode layer 180 may expose the underlying memory material layer 170 and does not provide a good conductivity between the memory material layer 170 and a contact (e.g., top electrode via 220 in FIG. 12); if the thickness T3 is greater than about 650 angstroms, the top electrode layer 180 may be out of the trench 144 (e.g., a bottom surface of the top electrode layer 180 is higher than a top surface of the second dielectric layer 140), thereby adversely affecting signal transmission of the alignment marks AM (see FIG. 7).

Figure 7:
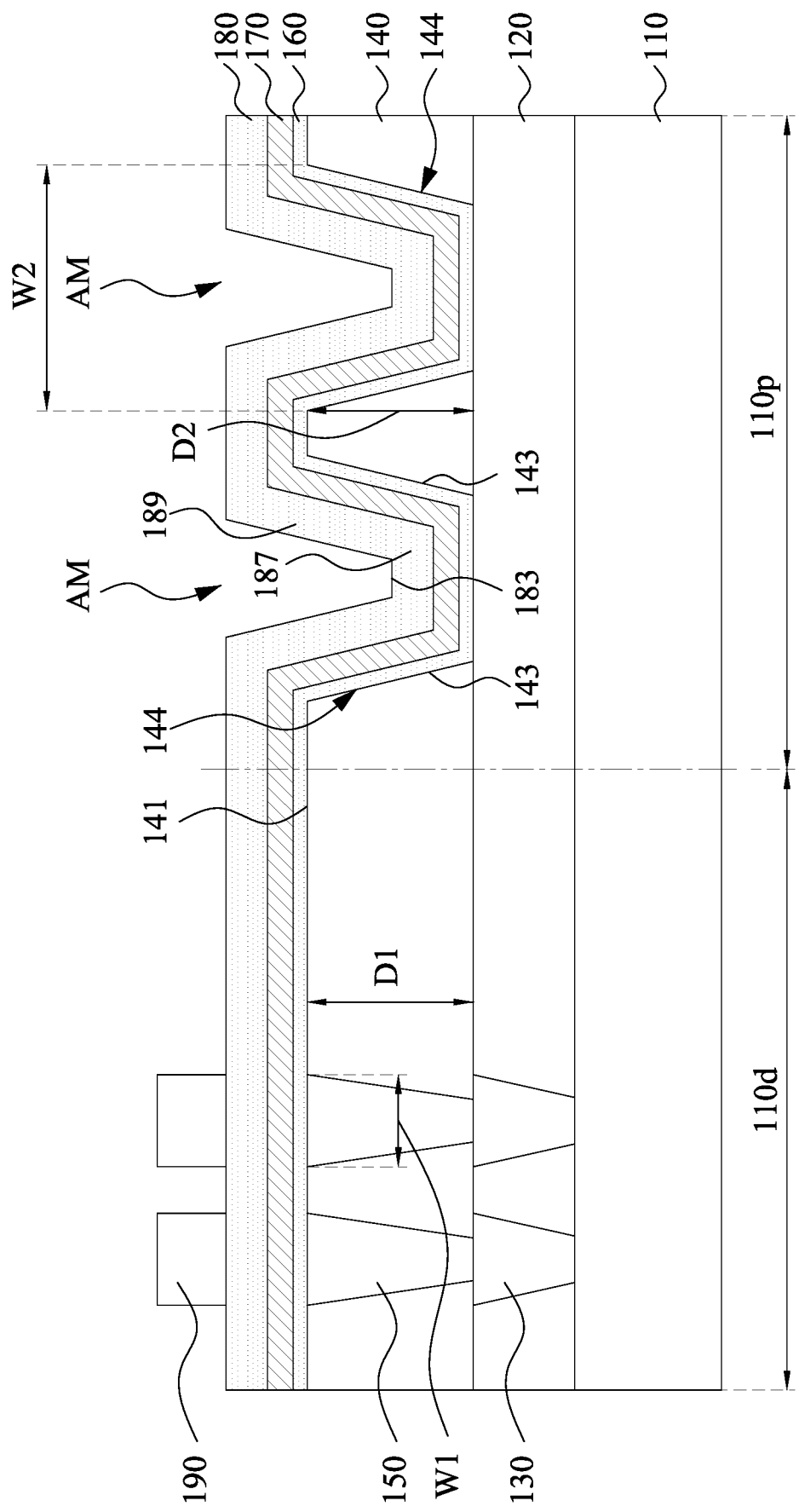

Reference is made to FIG. 7. A patterned mask 190 is formed over the device region 110d of the wafer 110. In some embodiments, the patterned mask 190 is aligned to the bottom electrode vias 150. Specifically, a vertical projection of the patterned mask 190 on the device region 110d of the wafer 110 overlaps with a vertical projection of the bottom electrode via 150 on the device region 110d of the wafer 110. In some embodiments, the trench 144 is referred as an alignment mark AM, in which the bottom electrode layer 160, the memory material layer 170, and the top electrode layer 180 in the trench 144 form a topographic profile. For example, the memory material layer 170 is conformally formed on the bottom electrode layer 160, and the top electrode layer 180 is conformally formed on the memory material layer 170. Alignment marks AM are used to permit precise alignment of photolithographic masks with a wafer during masking operations to minimize misalignment between multiple layers.

With such configuration, signal transmission from the alignment marks AM can be improved. Specifically, a mask layer is formed above the structure of FIG. 6, and a patterning process is performed to pattern the mask layer to form the patterned mask 190. In FIG. 7, the top electrode layer 180 has recesses at its top surface, and the recesses keep alignment signals and thus can be served as alignment marks AM for patterning the mask layer. These alignment marks AM promise that the patterned mask 190 can be disposed aligned to the bottom electrode vias 150.

In some embodiments, the bottom electrode via 150 has a maximum width W1 in a range of about 40 nanometers (nm) to about 60 nanometers, and a depth D1 in a range of about 50 nanometers to about 60 nanometers, in which a ratio of the maximum width W1 to the depth D1 is in a range from about 0.7 to about 1.2. If the ratio of the maximum width W1 to the depth D1 is greater than about 1.2, it may induce defects on the memory device to cause transition problem for memory layer (e.g., memory material layer 170 and/or memory layer 170a). If the ratio of the maximum width W1 to the depth D1 is less than 0.7, it may induce conductivity issues for bottom electrodes (e.g., bottom electrode layer 160 and/or bottom electrodes 160a). In some embodiments, the alignment mark AM has a maximum width W2 in a range of about 200 nanometers to about 400 nanometers, and a depth D2 in a range of about 60 nanometers to about 100 nanometers, in which a ratio of the maximum width W2 to the depth D2 is in a range from about 2 to about 6.7. As such, the layers (e.g., the bottom electrode layer 160, the memory material layer 170, and the top electrode layer) can be formed in the trench 144 and thus signal transmission can be improved. If the ratio of the maximum width W2 to the depth D2 is larger than 6.7, the misalignment between patterned mask 190 and the bottom electrode vias 150 would occur during masking operations; if the ratio of the maximum width W2 to the depth D2 is smaller than 2, the top electrode layer 180 may be out of the trench 144, thereby adversely affecting signal transmission of the alignment marks AM.

In some embodiments, if the bottom electrode layer 160, the memory material layer 170, and the top electrode layer 180 have a flat profile (e.g., the top surface of the top electrode layer 180 over the device region 110d of the wafer 110 is substantially coplanar with the top surface of the top electrode layer 180 over the peripheral region 110p of the wafer 110), a predetermined value of the signal transmission of a light source (e.g., green light, red light, near infrared light, or far infrared light) is less than 0.5 a.u., e.g., about 0. With the above-mentioned configuration (the multiple layers in the trench 144), the predetermined value of the signal transmission of the light source can be greater than 0.5 a.u., e.g., greater than about 3. That is, the signal transmission can be improved since the bottom electrode layer 160, the memory material layer 170, and the top electrode layer 180 in the trench 144 form the topographic profile. In some embodiments, the signal transmission of the light source is about 0 when the alignment mark AM has a flat top surface. In some embodiments, the predetermined value (e.g., about 0.5 a.u.) permits to distinguish the positions of the alignment marks AM during the masking process.

In some embodiments, the top electrode layer 180 in the trench 144 has a horizontal portion 187 and a vertical portion 189 on the horizontal portion 187. The vertical portion 189 of the top electrode layer 180 is substantially in parallel with the sidewall 143 of the second dielectric layer 140.

In some embodiments, the bottom electrode layer 160, the memory material layer 170, and the top electrode layer 180 does not fill the trench 144. In other words, a bottommost portion of a top surface 183 of the top electrode layer 180 in the trench 144 is lower than the top surface 141 of the second dielectric layer 140. In some embodiments, the patterned mask 190 may be a photoresist, a hard mask layer, a $SiN_X$ layer, or combinations thereof.

Figure 8:
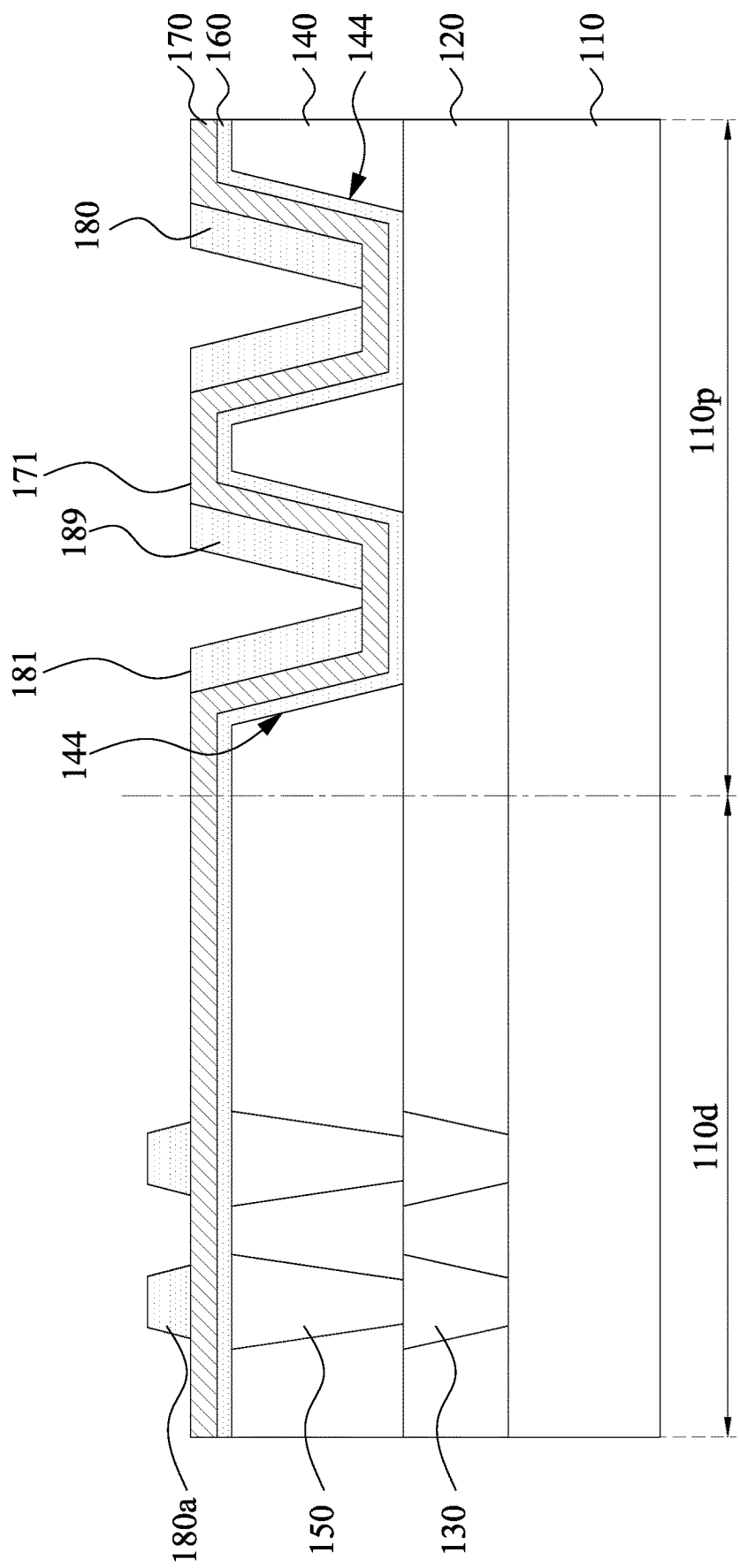

Reference is made to FIG. 7 and FIG. 8. The top electrode layer 180 is etched to form top electrodes 180a using the patterned mask 190 as an etch mask. In some embodiments, the top electrode 180a over the device region 110d of the wafer 110 has a trapezoid profile, in which a top surface of the top electrode 180a is narrower than a bottom surface of the top electrode 180a. In some embodiments, the top electrode layer 180 in the trench 144 is etched until the memory material layer 170 is exposed.

In some embodiments, etching the top electrode layer 180 over the device region 110d of the wafer 110 is performed such that the memory material layer 170 is exposed. In some embodiments, etching the top electrode layer 180 over the peripheral region 110p of the wafer 110 is performed such that a top surface 181 of the top electrode layer 180 in the trench 144 is substantially coplanar with a top surface 171 of the memory material layer 170 over the second dielectric layer 140. In some embodiments, the horizontal portion 187 of the top electrode layer 180 in the trench 144 is removed while the vertical portion 189 of the top electrode layer 180 remains on a sidewall 143 of the trench 144 (i.e., the sidewall 143 of the second dielectric layer 140).

In some embodiments, the top electrode layer 180 is etched, for example, using anisotropic etching processes such as reactive ion etching (RIE) using chlorine ($Cl_2$), HBr or $CF_4$ as an etchant for the top electrode layer 180.

Thereafter, the patterned mask 190 is removed. In some embodiments, removing the patterned mask 190 may be performed by using a photoresist strip process, such as an ashing process, and etching process, or other suitable processes.

Figure 9:
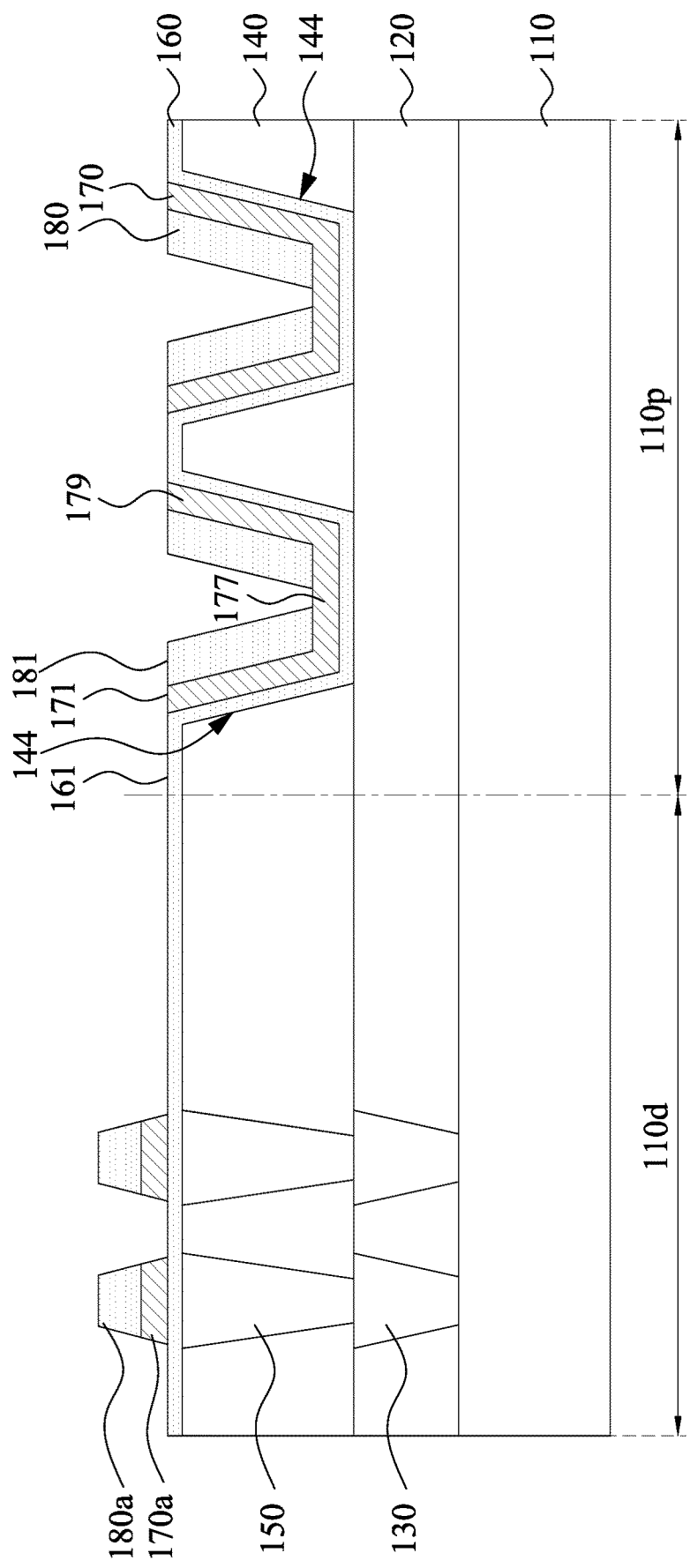

Reference is made to FIG. 8 and FIG. 9. The memory material layer 170 is etched to form memory layers 170a using the top electrodes 180a as etch masks. The memory layer 170a may be referred to be an MTJ stack. The etching process stops when the bottom electrode layer 160 is reached. In some embodiments, the top electrode 180a and the memory layer 170a form a trapezoid profile. In some embodiments, the bottom electrode layer 160, the memory material layer 170, and the top electrode layer 180 in the trench 144 is substantially unchanged during the etching process.

In some embodiments, etching the memory material layer 170 over the device region 110d of the wafer 110 is performed such that the bottom electrode layer 160 is exposed. In some embodiments, etching the memory material layer 170 over the peripheral region 110p of the wafer 110 further includes etching the top electrode layer 180. In addition, etching the memory material layer 170 and etching the top electrode layer 180 are performed such that the top surface 181 of the top electrode layer 180 and the top surface 171 of the memory material layer 170 in the trench 144 are substantially coplanar with a top surface 161 of the bottom electrode layer 160 over the second dielectric layer 140. In some embodiments, the memory material layer 170 over the peripheral region 110p of the wafer 110 has a horizontal portion 177 and a vertical portion 179 on the horizontal portion 177. The vertical portion 179 of the memory material layer 170 is substantially in parallel with the top electrode layer 180.

In some embodiments, the etching process may use dry etching. The process gas of the dry etching may include $CF_4$, $CHF_3$, $NF_3$, $SF_6$, $Br_2$, HBr, $Cl_2$, or combinations thereof. Diluting gases such as $N_2$, $O_2$, or Ar may optionally be used. In some embodiments, the etching process may use ion beam etching. The process ion of the ion beam etching may include Ar.

Figure 10:
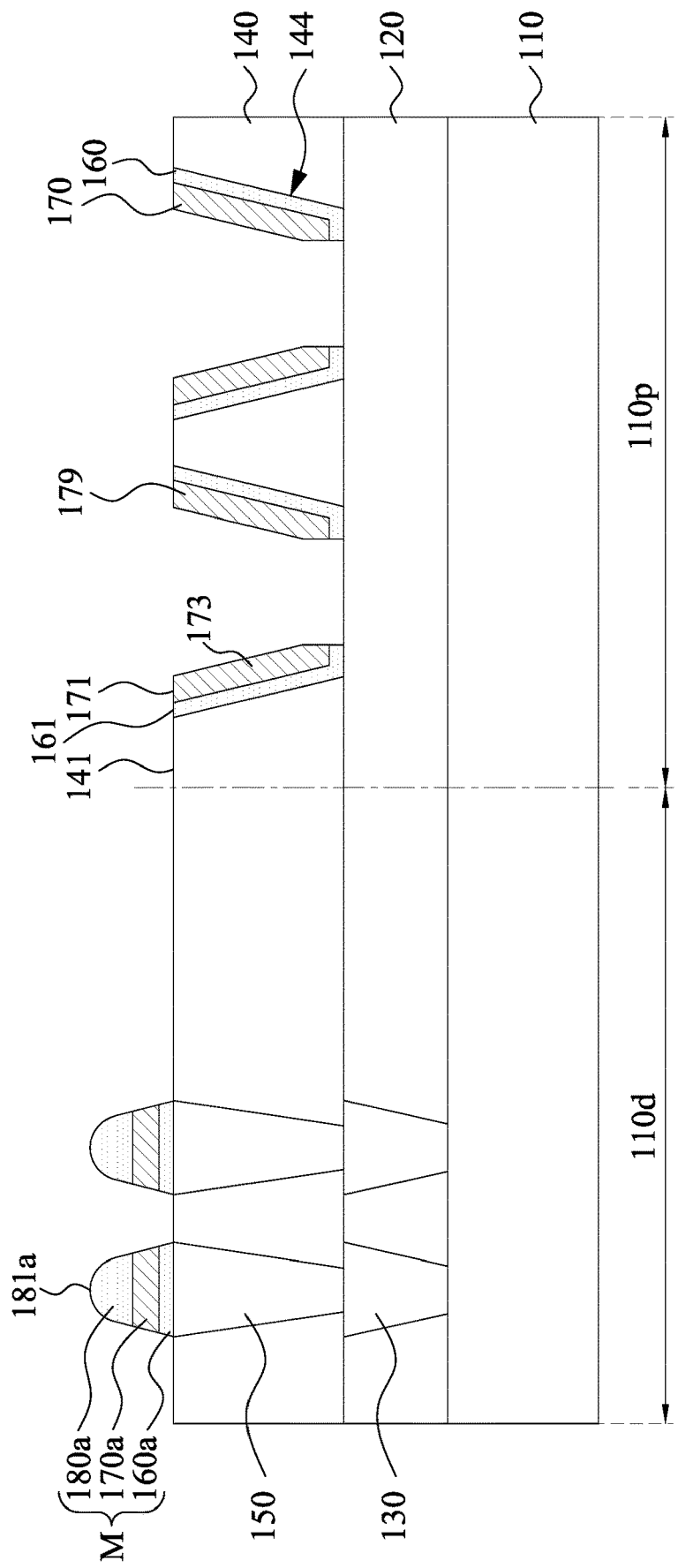

Reference is made to FIG. 9 and FIG. 10. The bottom electrode layer 160 is etched to form bottom electrodes 160a. The etching process stops when the second dielectric layer 140 is reached. In some embodiments, the bottom electrode 160a, the memory layer 170a, and the top electrode 180a form a trapezoid profile. In some embodiments, the bottom electrode 160a, the memory layer 170a, and the top electrode 180a are referred as a memory cell M.

In some embodiments, etching the bottom electrode layer 160 over the device region 110d of the wafer 110 is performed such that the second dielectric layer 140 is exposed. In some embodiments, etching the bottom electrode layer 160 over the device region 110d of the wafer 110 further includes etching the top electrode 180a such that a top surface 181a of the top electrode 180a form a curved shape. In some embodiments, etching the bottom electrode layer 160 over the peripheral region 110p of the wafer 110 further includes etching the top electrode layer 180 and the memory material layer 170. As a result, the first dielectric layer 120 and a sidewall 173 of the memory material layer 170 are exposed through the trench 144. The sidewall 173 of the memory material layer 170 is free of the top electrode layer 180. In addition, the top surface 181 of the top electrode layer 180 and the top surface 171 of the memory material layer 170 in the trench 144 are substantially coplanar with the top surface 141 of the second dielectric layer 140. In some embodiments, the horizontal portion 177 of the memory material layer 170 in the trench 144 is removed while the vertical portion 179 of the memory material layer 170 remains on a sidewall of the trench 144.

In some embodiments, the top electrode layer 180 in FIG. 8, the memory material layer 170 in FIG. 9, and the bottom electrode layer 160 in FIG. 10 are sequentially patterned by using the patterned mask 190 of FIG. 8 as etching masks.

In some embodiments, the etching process may use either dry or wet etching. When dry etching is used, the process gas may include $CF_4$, $CHF_3$, $NF_3$, $SF_6$, $Br_2$, HBr, $Cl_2$, or combinations thereof. Diluting gases such as $N_2$, $O_2$, or Ar may optionally be used. When wet etching is used, the etching solution (etchant) may include $NH_4OH:H_2O_2:H_2O$ (APM), $NH_2OH$, KOH, $HNO_3:NH_4F:H_2O$, and/or the like.

Figure 11:
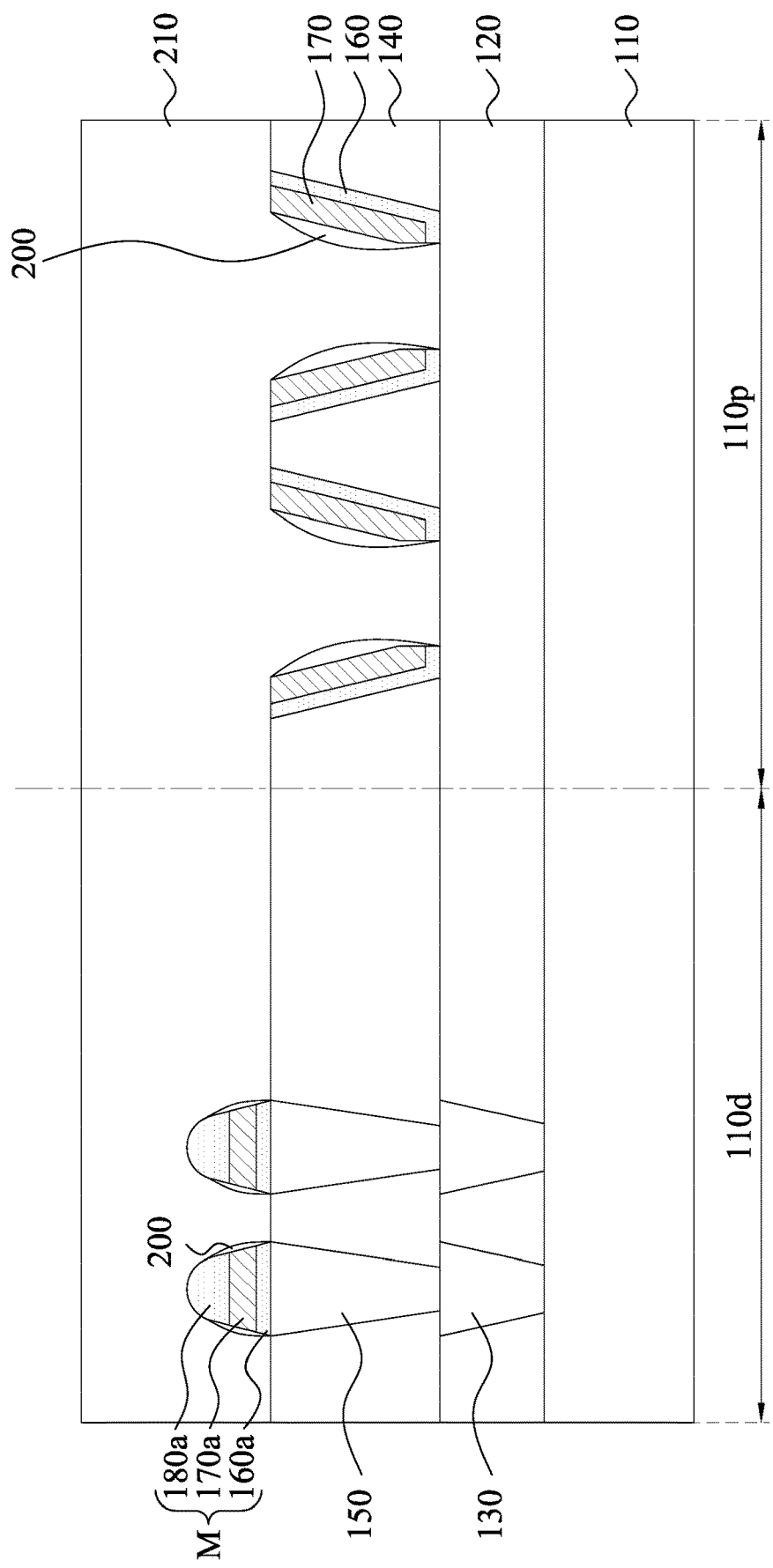

Reference is made to FIG. 10 and FIG. 11. Spacer structures 200 formed on sidewalls of the bottom electrode 160a, the memory layer 170a, and the top electrode 180a. In some embodiments, some of the spacer structures 200 are formed on sidewalls of the memory material layer 170 over the peripheral region 110p of the wafer 110. In some other embodiments, the spacer structures 200 may be omitted, and the sidewall of the memory material layer 170 over the peripheral region 110p of the wafer 110 is still exposed.

In some embodiments, the spacer structure 200 includes silicon oxide, silicon nitride, silicon carbide nitride (SiCN), silicon oxynitride (SiON), silicon carbide oxynitride (SiCON), or other suitable dielectric material. The spacer structure 200 may be formed by deposition and etching processes. The deposition process may be a chemical vapor deposition (CVD), physical vapor deposition (PVD), atomic layer deposition (ALD), or other suitable deposition techniques. The etching process may be an anisotropic dry etching process in one example.

Thereafter, a third dielectric layer 210 is deposited over the top electrode 180a and the second dielectric layer 140. Further, the third dielectric layer 210 fills the trench 144. The third dielectric layer 210 may include the same material as the second dielectric layer 140 in some embodiments. The third dielectric layer 210 may include, for example, silicon oxide, low-k silicon oxide such as a porous silicon oxide layer, other suitable dielectric material, combinations thereof, or the like. The third dielectric layer 210 may be formed by CVD, high-density plasma CVD, spin-on, sputtering, or other suitable methods.

Figure 12:
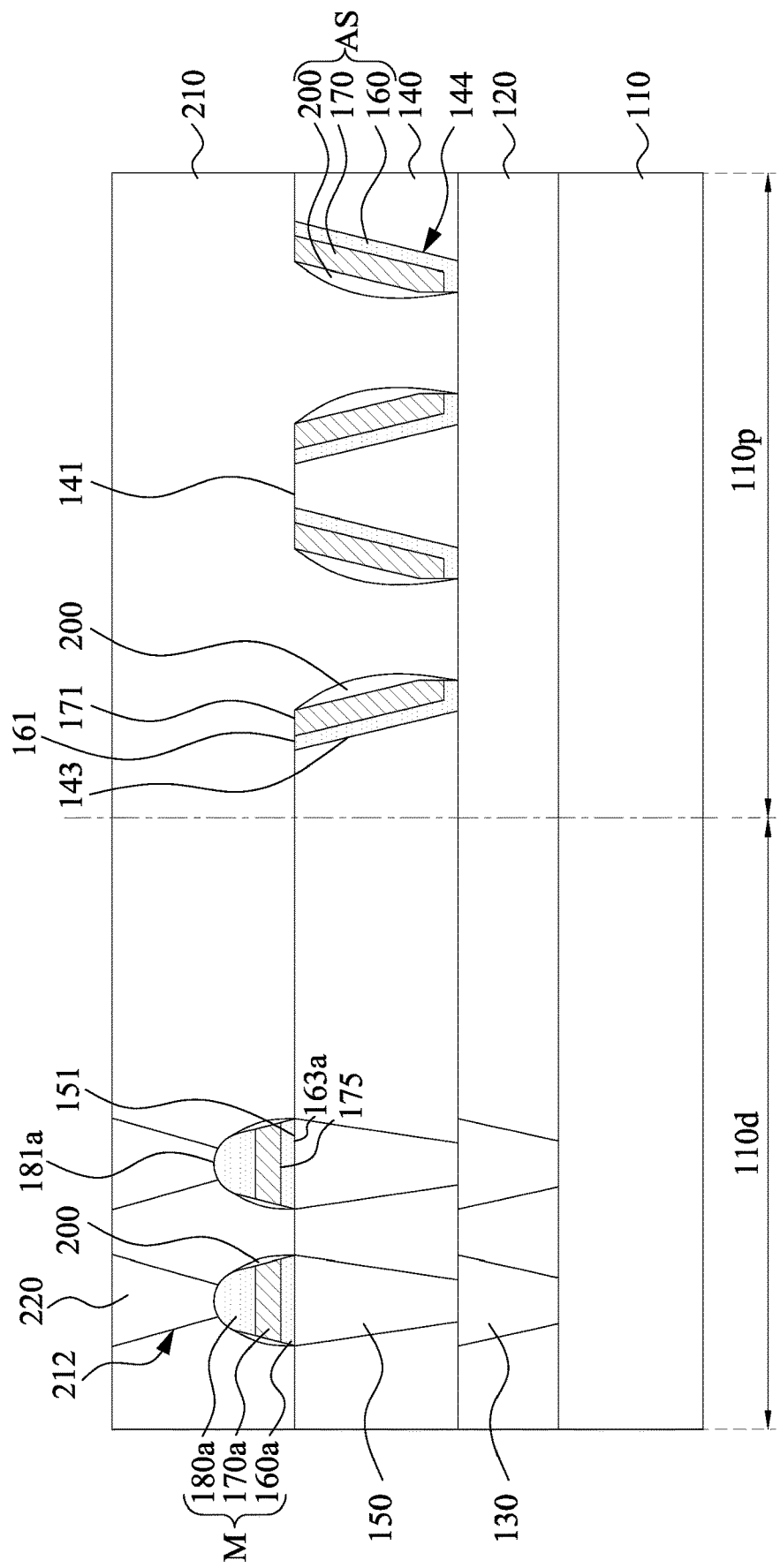

Reference is made to FIG. 12. After the third dielectric layer 210 is formed, an etching process is performed on the third dielectric layer 210 to form top via openings 212 in the third dielectric layer 210. After the formation, the top via opening 212 exposes the top electrode 180a.

Thereafter, a conductive material is filled in the top via openings 212 to form top electrode vias 220. The top electrode vias 220 are electrically connected to the top electrode 180a. In some embodiments, the top electrode vias 220 may be made of metal, such as tungsten (W), cobalt (Co), ruthenium (Ru), aluminum (Al), copper (Cu), or other suitable materials. After the deposition of the conductive material, a planarization process, such as a chemical mechanical planarization (CMP) process, may be then performed to remove excess conductive material outside the top via openings 212 to form the top electrode vias 220.

In some embodiments, the top electrode vias 220 and the bottom electrode vias 150 include the same materials. For example, the top electrode vias 220 and the bottom electrode vias 150 are made of tungsten.

In some embodiments, the top electrode vias 220 have a similar or the same configuration as the bottom electrode vias 150. For example, each of the top electrode vias 220 includes a barrier layer and a filling layer over the barrier layer. The configuration and materials of the barrier layer of the top electrode via 220 are similar or the same as that of the bottom electrode via 150, and configuration and materials of the filling layer of the top electrode via 220 are similar or the same as that of the bottom electrode via 150.

In some embodiments, the memory device in FIG. 12 includes the wafer 110, the bottom electrode vias 150, the memory cells M, and the alignment structure AS. The wafer 110 has the device region 110d and the peripheral region 110p adjacent to (e.g., surrounding) the device region 110d. The bottom electrode vias 150 are disposed in the second dielectric layer 140 and over the device region 110d of the wafer 110. The memory cells M are disposed over the bottom electrode vias 150, respectively. Each of the memory cell M includes the bottom electrode 160a, the memory layer 170a, and the top electrode 180a. The bottom electrode 160a is disposed over and connected to the bottom electrode vias 150. The memory layer 170a is disposed over the bottom electrode 160a. The top electrode 180a is disposed over the memory layer 170a.

In some embodiments, the bottom electrode 160a is in contact with the bottom electrode vias 150. In some embodiments, a width of a top surface 151 of the bottom electrode via 150 is substantially equal to a width of a bottom surface 163a of the bottom electrode 160a. The memory layer 170a may be referred as an MTJ stack. In some embodiments, the bottom electrode 160a, the memory layer 170a, and the top electrode 180a form the trapezoid profile. The top electrode 180a has the curved top surface 181a.

In some embodiments, the alignment structures AS are embedded in the second dielectric layer 140 and over the peripheral region 110p of the wafer 110. Each of the alignment structures AS includes the bottom electrode layer 160 and the memory material layer 170. It is noted that the alignment structures AS in FIG. 12 are residues of the alignment mark AM in FIG. 7 after the patterning processes of the bottom electrode layer 160, the memory material layer 170, and the top electrode layer 180 are performed. For example, the alignment structures AS in FIG. 12 refers to the multiple layers (e.g., the bottom electrode layer 160 and the memory material layer 170) in the trench 144, and the alignment mark AM in FIG. 7 also refers to the multiple layers (e.g., the bottom electrode layer 160, the memory material layer 170, and the top electrode layer 180) in the trench 144.

The bottom electrode layer 160 is in contact with and lining with an inner sidewall 143 of the second dielectric layer 140. In greater details, the bottom electrode layer 160 has an inclined portion and a bottom portion below the inclined portion, in which the inclined portion is disposed on the inner sidewall 143 of the second dielectric layer 140 and the bottom portion extends horizontally from the second dielectric layer 140. The memory material layer 170 is disposed on the bottom electrode layer 160. In some embodiments, the top surface 171 of the memory material layer 170 is lower than a bottom surface 175 of the memory layer 170a of the memory cell M. In some embodiments, the top surface 171 of the memory material layer 170 is not higher than the top surface 141 of the second dielectric layer 140. For example, the top surface 171 of the memory material layer 170 is substantially coplanar with the top surface 141 of the second dielectric layer 140. In some embodiments, the top surface 161 of the bottom electrode layer 160 and the top surface 171 of the memory material layer 170 over the peripheral region 110p of the wafer 110 are substantially coplanar with the top surface 141 of the second dielectric layer 140. In some embodiments, the memory material layer 170 is in contact with the bottom electrode layer 160, while spaced apart from the second dielectric layer 140.

In some embodiments, each of the alignment structures AS further includes the spacer structure 200 covering the memory material layer 170. The memory material layer 170 is disposed between the spacer structure 200 and the bottom electrode layer 160. In some embodiments, the spacer structure 200 is in contact with the memory material layer 170. In some embodiments, the spacer structure 200 is in contact with the bottom portion of the bottom electrode layer 160. In seine embodiments, the spacer structure 200 is disposed on sidewalls of the bottom electrode 160a, the memory layer 170a, and the top electrode 180a.

In some embodiments, the bottom electrode layer 160 of the alignment structure AS is made of a material the same as the bottom electrode 160a of the memory cell M. In some embodiments, the memory material layer 170 of the alignment structure AS is made of a material the same as the memory material layer 170a of the memory cell M.

In some embodiments, the memory device further includes the conductive features 130 between the bottom electrode vias 150 and the wafer 110. The conductive features 130 and the bottom electrode vias 150 may include different materials.

In some embodiments, the memory device further includes top electrode vias 220 on the top electrode 180a. The top electrode vias 220 are electrically connected to the top electrode 180a. The top electrode vias 220 and the bottom electrode vias 150 may include the same materials.

In some embodiments, the memory device further includes the first dielectric layer 120 over the wafer 110. The memory device further includes the second dielectric layer 140 over the first dielectric layer 120. In other words, the first dielectric layer 120 surrounds the conductive features 130, and the second dielectric layer 140 surrounds the bottom electrode vias 150. In some embodiments, the memory device further includes the third dielectric layer 210 over the first dielectric layer 120. The third dielectric layer 210 covers the bottom electrode vias 150 and the second dielectric layer 140 over the device region 110d of the wafer 110. The third dielectric layer 210 has a portion in the trench 144 of the second dielectric layer 140 and other portions over the second dielectric layer 140.

Based on the above discussions, it can be seen that the present disclosure offers advantages. It is understood, however, that other embodiments may offer additional advantages, and not all advantages are necessarily disclosed herein, and that no particular advantages are required for all embodiments. One advantage is that the bottom electrode layer, the memory material layer, and the top electrode layer in the trench form the topographic profile, such that the signal transmission can be improved, and thus the patterned mask can be disposed aligned to the bottom electrode via. Another advantage is that no additional process, which would increase the manufacture cost, is included in the method for manufacturing the memory device. For example, the bottom electrode via selectively grown on the conductive feature.

According to some embodiments, a method for manufacturing a memory device includes forming a dielectric layer over a wafer, wherein the wafer has a device region and a peripheral region adjacent to the device region. A bottom via opening is formed in the dielectric layer and over the device region of the wafer and a trench is formed in the dielectric layer and over the peripheral region of the wafer. A bottom electrode via is formed in the bottom via opening. A bottom electrode layer is conformally formed over the bottom electrode via and lining a sidewall and a bottom of the trench. A memory layer and a top electrode are formed over the bottom electrode layer.

According to some embodiments, a method for manufacturing a memory device includes forming a dielectric layer over a wafer. A bottom via opening and a trench are formed in the dielectric layer. A bottom electrode via is formed in the bottom via opening. A bottom electrode layer, a memory material layer, and a top electrode layer are sequentially formed over the dielectric layer and in the trench. A patterned mask is formed over the top electrode layer by using a portion of the top electrode layer in the trench as an alignment mark. The top electrode layer, the memory material layer, and the bottom electrode layer are sequentially patterned by using the patterned mask as an etching mask.

According to some embodiments, a memory device includes a wafer, a dielectric layer, a bottom electrode via, a memory cell, and an alignment structure. The wafer has a device region and a peripheral region adjacent to the device region. The dielectric layer is disposed over the wafer. The bottom electrode via is disposed in the dielectric layer and over the device region of the wafer. The memory cell is disposed over the bottom electrode via. The memory cell includes a bottom electrode, a memory layer, and a top electrode. The bottom electrode is connected to the bottom electrode via. The memory layer is disposed over the bottom electrode. The top electrode is disposed over the memory layer. The alignment structure is embedded in the dielectric layer and over the peripheral region of the wafer. The alignment structure includes a conductive layer and a memory material layer. The conductive layer is in contact with and lining an inner sidewall of the dielectric layer. The memory material layer over the conductive layer, in which a top surface of the memory material layer is lower than a bottom surface of the memory layer of the memory cell.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    forming a dielectric layer over a wafer, wherein the wafer has a device region and a peripheral region adjacent to the device region;
    forming a bottom via opening in the dielectric layer and over the device region of the wafer and a trench in the dielectric layer and over the peripheral region of the wafer;
    forming a bottom electrode via in the bottom via opening, wherein forming the bottom electrode via is performed by a selectively growing process;
    conformally forming a bottom electrode layer over the bottom electrode via and lining a sidewall and a bottom of the trench; and
    forming a memory layer and a top electrode over the bottom electrode layer.

2. The method of claim 1, wherein conformally forming the bottom electrode layer is such that the bottom electrode layer is in contact with the sidewall of the trench.

3. The method of claim 1, wherein forming the memory layer and the top electrode comprises:
   forming a memory material layer over the bottom electrode layer; and
   etching the memory material layer to form the memory layer over the device region of the wafer.

4. The method of claim 3, wherein forming the memory material layer is such that a portion of the memory material layer over the peripheral region of the wafer is spaced apart from the dielectric layer.

5. The method of claim 3, wherein forming the memory material layer is such that a bottommost portion of a top surface of the memory material layer is lower than a top surface of the dielectric layer.

6. The method of claim 3, wherein forming the memory layer and the top electrode further comprises:
   forming a top electrode layer over the memory material layer; and
   etching the top electrode layer to form the top electrode over the device region of the wafer.

7. The method of claim 6, wherein forming the top electrode layer is such that a bottommost portion of a top surface of the top electrode layer is lower than a top surface of the dielectric layer.

8. The method of claim 1, further comprising:
   forming a top electrode via on the top electrode.

9. A method, comprising:
   forming a dielectric layer over a wafer;
   forming a bottom via opening and a trench in the dielectric layer;
   forming a bottom electrode via in the bottom via opening;
   sequentially forming a bottom electrode layer, a memory material layer, and a top electrode layer over the dielectric layer and in the trench;
   forming a patterned mask over the top electrode layer by using a portion of the top electrode layer in the trench as an alignment mark; and
   sequentially patterning the top electrode layer, the memory material layer, and the bottom electrode layer by using the patterned mask as an etching mask, wherein patterning the bottom electrode layer is such that the dielectric layer is exposed through the trench.

10. The method of claim 9, wherein patterning the top electrode layer is such that a horizontal portion of the top electrode layer in the trench is removed while a vertical portion of the top electrode layer remains on a sidewall of the trench.

11. The method of claim 9, wherein patterning the memory material layer is such that a horizontal portion of the memory material layer in the trench is removed while a vertical portion of the memory material layer remains on a sidewall of the trench.

12. The method of claim 9, wherein patterning the bottom electrode layer is such that a sidewall of the patterned memory material layer is exposed through the trench.

13. The method of claim 12, further comprising:
   forming a spacer structure on the patterned memory material layer after patterning the bottom electrode layer.

14. A method comprising:
   forming a bottom electrode layer over a bottom electrode via and a trench in a first dielectric layer on a wafer;
   sequentially forming a memory material layer and a top electrode layer over the bottom electrode layer;
   forming a patterned mask over the top electrode layer by using a portion of the top electrode layer in the trench as an alignment mark;
   patterning the top electrode layer, the memory material layer, and the bottom electrode layer by using the patterned mask as an etching mask; and
   forming a spacer structure in contact with sidewalls of the bottom electrode layer and the memory material layer in the trench.

15. The method of claim 14, wherein the bottom electrode layer is patterned such that the first dielectric layer is exposed through the trench.

16. The method of claim 14, wherein the bottom electrode layer is patterned such that the sidewalls of the bottom electrode layer are in the trench.

17. The method of claim 14, further comprising:
   forming a second dielectric layer over the spacer structure and in contact with the first dielectric layer in the trench.

18. The method of claim 17, further comprising:
   forming a top via in the second dielectric layer and electrically connected to the top electrode layer on the bottom electrode via.

19. The method of claim 14, wherein the memory material layer is disposed between the spacer structure and the bottom electrode layer.

20. The method of claim 14, wherein the bottom electrode layer, the memory material layer and the spacer structure in the trench form an alignment structure.

* * * * *